United States Patent
Yamamoto et al.

(10) Patent No.: US 7,912,275 B2
(45) Date of Patent: Mar. 22, 2011

(54) METHOD OF EVALUATING A PHOTO MASK AND METHOD OF MANUFACTURING A SEMICONDUCTOR DEVICE

(75) Inventors: Hiroki Yamamoto, Kamakura (JP); Masamitsu Itoh, Yokohama (JP); Osamu Ikenaga, Yokohama (JP); Shoji Mimotogi, Yokohama (JP); Hideki Kanai, Wappingers Falls, NY (US); Yukiyasu Arisawa, Tsukuba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 183 days.

(21) Appl. No.: 12/360,929

(22) Filed: Jan. 28, 2009

(65) Prior Publication Data
US 2009/0202924 A1    Aug. 13, 2009

(30) Foreign Application Priority Data
Jan. 29, 2008    (JP) ................. 2008-018034

(51) Int. Cl.
*G06K 9/00* (2006.01)
*G03F 1/00* (2006.01)

(52) U.S. Cl. ............................. 382/144; 430/5

(58) Field of Classification Search ............. 382/144; 430/5
See application file for complete search history.

(56) References Cited

U.S. PATENT DOCUMENTS
2006/0190875 A1    8/2006    Arisawa et al.

FOREIGN PATENT DOCUMENTS
JP    2003-241364    8/2003

*Primary Examiner* — Stephen Rosasco
*Assistant Examiner* — John Ruggles
(74) *Attorney, Agent, or Firm* — Finnegan, Henderson, Farabow, Garrett & Dunner, L.L.P.

(57) ABSTRACT

A method of evaluating a photo mask, includes measuring each dimension of a plurality of pattern portions of a mask pattern formed on a photo mask, obtaining an inter-pattern distance between the pattern portion and a pattern different from the pattern portion with respect to each of the pattern portions, obtaining a dimensional difference between the measured dimension of the pattern portion and a target dimension of the pattern portion with respect to each of the pattern portions, grouping the dimensional difference obtained for each pattern portion into a plurality of groups in accordance with the inter-pattern distance obtained for each pattern portion, obtaining an evaluation value based on the dimensional difference in each group with respect to each of the groups, and evaluating the photo mask based on the evaluation value.

13 Claims, 2 Drawing Sheets

| | Inter-pattern distance D | Dimensional difference \|W − Wt\| | Evaluation value | Reference value |
|---|---|---|---|---|
| Group 1 | $D < a_1$ | $f_{11}, f_{12} \cdots$ | $e_1$ | $c_1$ |
| Group 2 | $a_1 \leqq D < a_2$ | $f_{21}, f_{22} \cdots$ | $e_2$ | $c_2$ |
| Group 3 | $a_2 \leqq D < a_3$ | $f_{31}, f_{32} \cdots$ | $e_3$ | $c_3$ |
| Group 4 | $a_3 \leqq D$ | $f_{41}, f_{42} \cdots$ | $e_4$ | $c_4$ |
FIG. 3
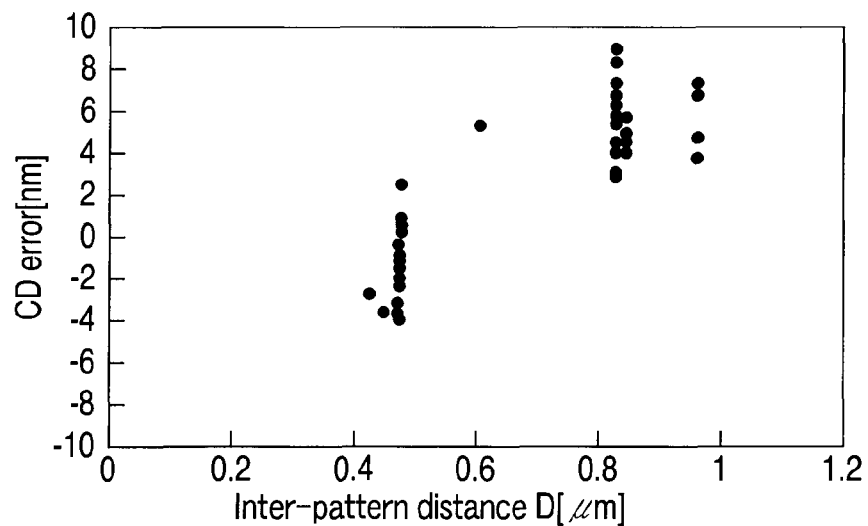
FIG. 4
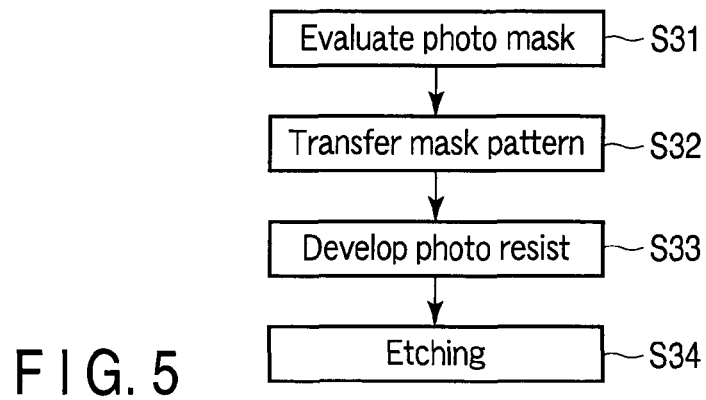
FIG. 5

US 7,912,275 B2

METHOD OF EVALUATING A PHOTO MASK AND METHOD OF MANUFACTURING A SEMICONDUCTOR DEVICE

CROSS-REFERENCE TO RELATED APPLICATIONS

This application is based upon and claims the benefit of priority from prior Japanese Patent Application No. 2008-018034, filed Jan. 29, 2008, the entire contents of which are incorporated herein by reference.

BACKGROUND OF THE INVENTION

1. Field of the Invention

The present invention relates to a method of evaluating a photo mask, and to a method of manufacturing a semiconductor device.

2. Description of the Related Art

In order to manufacture a high-accuracy semiconductor device, it is important to produce a high-accuracy photo mask. For this reason, a method of evaluating a photo mask and an evaluation system have been proposed (e.g., see Jpn. Pat. Appln. KOKAI Publication No. 2003-241364).

However, advance in scale reduction and complication of a mask pattern is made; as a result, it is difficult to accurately evaluate a photo mask. For example, the following case occurs; specifically, a photo mask, which is inherently an acceptable product, is regarded as an unacceptable product.

BRIEF SUMMARY OF THE INVENTION

A first aspect of the present invention, there is provided a method of evaluating a photo mask, comprising: measuring each dimension of a plurality of pattern portions of a mask pattern formed on a photo mask; obtaining an inter-pattern distance between the pattern portion and a pattern different from the pattern portion with respect to each of the pattern portions; obtaining a dimensional difference between the measured dimension of the pattern portion and a target dimension of the pattern portion with respect to each of the pattern portions; grouping the dimensional difference obtained for each pattern portion into a plurality of groups in accordance with the inter-pattern distance obtained for each pattern portion; obtaining an evaluation value based on the dimensional difference in each group with respect to each of the groups; and evaluating the photo mask based on the evaluation value.

A second aspect of the present invention, there is provided a method of manufacturing a semiconductor device, comprising: transferring a mask pattern on a photo mask evaluated by the above method to a photo resist on a semiconductor substrate.

BRIEF DESCRIPTION OF THE SEVERAL VIEWS OF THE DRAWING

FIG. 3 is a table to explain groups according to an embodiment of the present invention;

FIG. 4 is a graph showing the relationship between an inter-pattern distance and a CD error according to an embodiment of the present invention; and FIG. 5 is a flowchart to schematically explain a method of manufacturing a semiconductor device according to an embodiment of the present invention.

DETAILED DESCRIPTION OF THE INVENTION

An embodiment of the present invention will be hereinafter described with reference to the accompanying drawings.

Figure 1:
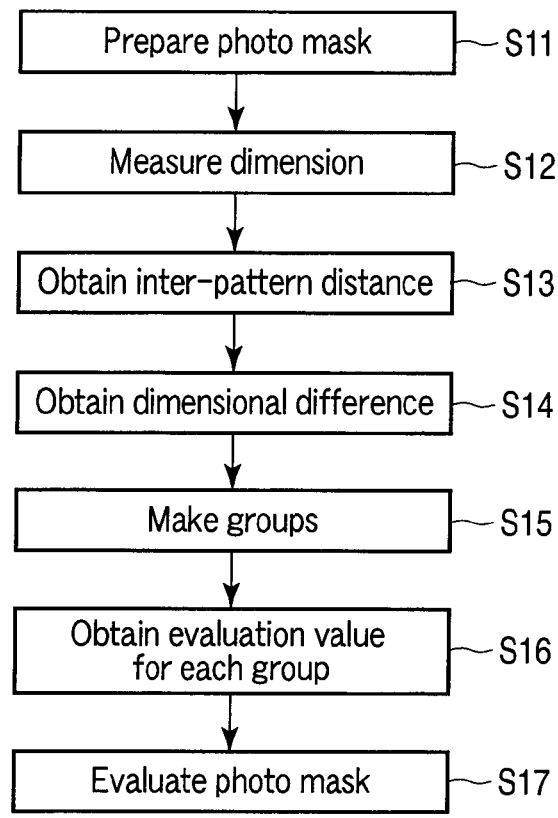
FIG. 1 is a flowchart to explain a method of evaluating a photo mask according to an embodiment of the present invention.

FIG. 1 is a flowchart to explain a method of evaluating a photo mask according to an embodiment of the present invention.

First, a photo mask formed with a mask pattern is prepared (S11). Optical proximity correction (OPC) and process proximity correction (PPC) are made with respect to a mask pattern formed on a photo mask.

Figure 2:
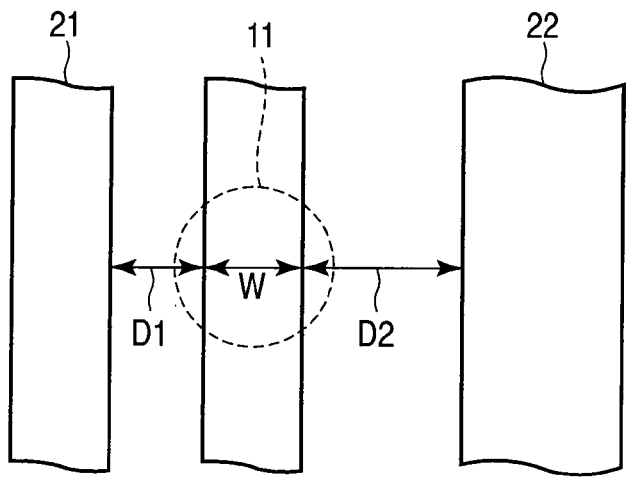
FIG. 2 is a view showing a measurement target pattern portion according to an embodiment of the present invention.

Then, the dimension of a plurality of pattern portions (measurement target pattern portions) of the mask pattern formed on the photo mask is measured (S12). In other words, a mask pattern dimension is measured at a plurality of portions on the photo mask. Specifically, as shown in FIG. 2, a pattern width W of a measurement target pattern portion 11 is measured. An inter-pattern distance between the measurement target pattern portion and a pattern neighboring there is measured with respect to each of a plurality of measurement target pattern portions (S13). Specifically, as seen from FIG. 2, the following inter-pattern distances (inter-edge distance) D1 and D2 are measured. The foregoing D1 is an inter-pattern distance between the measurement target pattern portion 11 and a neighboring pattern 21. The foregoing D2 is an inter-pattern distance between the measurement target pattern portion 11 and a neighboring pattern 22. An average value D (D=(D1+D2)/2) of the inter-pattern distances D1 and D2 is set as an average inter-pattern distance. In the following description, the foregoing average inter-pattern distance D is used as an inter-pattern distance, as far as reference is not specially made. Incidentally, the foregoing pattern width W. inter-pattern distances D1 and D2 can be determined from an image obtained by an electron microscope.

In this case, the inter-pattern distance is not necessarily determined using the distance between neighboring patterns. A value is defined based on a distance between a predetermined measurement target pattern and any pattern different from the predetermined pattern. The defined value may be defined as an inter-pattern distance of the predetermined pattern. For example, each inter-pattern distance between the predetermined pattern and a plurality of peripheral patterns different from the predetermined pattern is measured. Based on the measured value, a value expressing pattern density may be regarded as an inter-pattern distance.

Then, a dimensional difference (|W−Wt|) between the measured dimension of the measurement target pattern portion (dimension W obtained in step S12) and a target dimension Wt thereof is calculated with respect to each of the measurement target pattern portions (S14). The target dimension Wt expressing a pattern dimension to be formed on a mask is previously determined by calculation. For example, based on mask pattern writing data, the target dimension Wt is previously calculated.

Thereafter, the dimensional difference obtained for each measurement target pattern portion is grouped into a plurality of groups in accordance with the inter-pattern distance obtained for each measurement target pattern portion (S15).

FIG. 3 is a table to explain the foregoing groups. As seen from the table of FIG. 3, the dimensional difference is grouped into four groups 1 to 4 in accordance with the inter-pattern distance D. Hereinafter, the detailed explanation will be made.

For example, when an inter-pattern distance D of a measurement target pattern portion P1 is D<a1 (a1 is a predetermined boundary value), a dimensional difference (|W−Wt|) of the portion P1 is assigned to a group 1. Moreover, when an inter-pattern distance D of a measurement target pattern portion P2 is a1≦D<a2 (a1 and a2 are a predetermined boundary value), a dimensional difference (|W−Wt|) of the portion P2 is assigned to a group 2. In the same manner as described above, dimensional differences are assigned to group 3 and group 4 in accordance with an inter-pattern distance.

The dimensional difference |W−Wt| (in FIG. 3, dimensional difference $f_{11}$, $f_{12}$, . . . ) of the measurement target pattern portion having the inter-pattern distance D (D<a1) is set to the group 1. The dimensional difference (in FIG. 3, dimensional difference $f_{21}$, $f_{22}$, . . . ) of the measurement target pattern portion having the inter-pattern distance D (a1≦D<a2) is set to the group 2. Likewise, the dimensional difference (in FIG. 3, dimensional difference $f_{31}$, $f_{32}$, . . . ) of the measurement target pattern portion having the inter-pattern distance D (a2≦D<a3) is set to the group 3. The dimensional difference (in FIG. 3, dimensional difference $f_{41}$, $f_{42}$, . . . ) of the measurement target pattern portion having the inter-pattern distance D (a3≦D) is set to the group 4.

FIG. 4 is a graph plotting the relationship between the inter-pattern distance D and a CD error (corresponding to dimensional difference between measured dimension and target dimension) with respect to actual mask patterns. In this case, for example, one group having D<0.7 μm is formed, and the other group having 0.7 μm≦D is formed.

An evaluation value based on the dimensional difference in each group is determined with respect to each of the foregoing groups (groups 1 to 4) (S16). In this case, a value expressing variations of measurement dimension with respect to the target dimension is usable as the evaluation value. Specifically, a value expressing an average of the dimensional differences in the group is usable as the evaluation value. For example, root mean square (rms) of the dimensional differences in the group is used as the evaluation value. The foregoing evaluation value will be described using the table of FIG. 3. If the number of the dimensional differences grouped into the group 1 is set to n, an evaluation value e1 of the group 1 is expressed by the following equation.

$$e1=\{(f_{11}^2+f_{12}^2+\ldots+f_{1n}^2)/n\}^{1/2}$$

Thus, evaluation values e2, e3 and e4 of groups 2, 3 and 4 are expressed in the same manner as described above.

Then, a photo mask is evaluated based on the evaluation value obtained in step S16 (S17). Specifically, it is determined whether or not the evaluation value satisfies an evaluation criterion for each group. The explanation will be made below using FIG. 3. In the group 1, it is determined whether or not the evaluation value e1 is smaller than a predetermined reference value c1. If the evaluation value e1 is smaller than the reference value c1, in the group 1, it is determined that the evaluation value satisfies the evaluation criterion. Likewise, in the group 2, if the evaluation value e2 is smaller than a reference value c2, it is determined that the evaluation value satisfies the evaluation criterion. The same determination as above is made in the groups 3 and 4. The foregoing reference values (c1 to c4) are set for each group in accordance with the inter-pattern distance. In the groups having a larger inter-pattern distance D, the reference value is set larger. Based on the evaluation result, it is determined whether or not a photo mask is acceptable. For example, in all groups (groups 1 to 4), if it is determined that the evaluation value satisfies the evaluation criterion, it is determined that the photo mask is acceptable.

As described above, according to this embodiment, the dimensional difference (between measured dimension and target dimension) obtained for each measurement target pattern portion is grouped into a plurality of groups in accordance with the inter-pattern distance obtained for each measurement target pattern portion. Further, the evaluation value based on the dimensional difference is obtained for each group. The method described above is employed, and thereby, according to this embodiment, it is possible to accurately evaluate the photo mask. Therefore, it is possible to accurately determine whether or not the photo mask is acceptable. The explanation will be additionally made below.

In many case, it is general that photolithography margin is taken in the following manner. Specifically, photolithography margin is taken larger at a portion having a large inter-pattern distance D. Conversely, the photolithography margin is taken smaller at a portion having a small inter-pattern distance D. Therefore, the dimensional difference between measured dimension and target dimension may be larger to some degree at a portion having a large inter-pattern distance D. However, the dimensional difference between measured dimension and target dimension must be set so that it does not become large at a portion having a small inter-pattern distance D. In other words, the evaluation value of the dimensional difference may be relatively larger at a portion having a large inter-pattern distance D, compared with a portion having a small inter-pattern distance D. Therefore, it is rational to change the evaluation criterion of the evaluation value of the dimensional difference in accordance with the inter-pattern distance. According to this embodiment, the evaluation value of the dimensional difference is obtained for each group in accordance with the inter-pattern distance. As a result, it is possible to make a rational evaluation, and to accurately evaluate the photo mask.

A semiconductor device is manufactured using a mask evaluated according to the method of evaluating the photo mask described in the foregoing embodiment. FIG. 5 is a flowchart to schematically explain a method of manufacturing a semiconductor device.

First, the foregoing method is used to evaluate a photo mask (S31). A mask pattern on a photo mask is transferred to a photo resist on a semiconductor wafer using the photo mask determined as acceptable (S32). The photo resist is developed to form a photo resist pattern (S33). Thereafter, etching is carried out using the photo resist pattern as a mask, and a pattern is formed on the semiconductor wafer (S34).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A method of evaluating a photo mask, comprising:
measuring each dimension of a plurality of pattern portions of a mask pattern formed on a photo mask;
obtaining an inter-pattern distance between the pattern portion and a pattern different from the pattern portion with respect to each of the pattern portions;
obtaining a dimensional difference between the measured dimension of the pattern portion and a target dimension of the pattern portion with respect to each of the pattern portions;

grouping the dimensional difference obtained for each pattern portion into a plurality of groups in accordance with the inter-pattern distance obtained for each pattern portion;

obtaining an evaluation value based on the dimensional difference in each group with respect to each of the groups; and evaluating the photo mask based on the evaluation value.

2. The method according to claim 1, wherein obtaining the inter-pattern distance includes obtaining a distance between the pattern portion and a pattern adjacent to the pattern portion.

3. The method according to claim 1, wherein obtaining the inter-pattern distance includes:

obtaining distances between the pattern portion and a plurality of patterns adjacent to the pattern portion; and obtaining an average of the obtained distances.

4. The method according to claim 1, wherein the dimension of the pattern portion includes a width of the pattern portion.

5. The method according to claim 1, wherein the target dimension is obtained using calculation.

6. The method according to claim 1, wherein the target dimension is previously obtained based on writing data of the mask pattern.

7. The method according to claim 1, wherein the evaluation value evaluates a variation of the dimensional difference in each group.

8. The method according to claim 1, wherein the evaluation value expresses an average of the dimensional difference in each group.

9. The method according to claim 1, wherein the evaluation value expresses root mean square of the dimensional difference in each group.

10. The method according to claim 1, wherein evaluating the photo mask includes:

determining whether or not the evaluation value satisfies an evaluation criterion determined for each group.

11. The method according to claim 10, wherein evaluating the photo mask further includes:

determining that the photo mask is acceptable when the evaluation value satisfies the evaluation criterion in all groups.

12. The method according to claim 1, wherein evaluating the photo mask includes:

determining whether or not the evaluation value is smaller than a predetermined reference value.

13. The method according to claim 12, wherein the reference value is set larger in a group having a larger inter-pattern distance.

* * * * *